United States Patent
De Silva et al.

(10) Patent No.: US 10,975,464 B2
(45) Date of Patent: Apr. 13, 2021

(54) HARD MASK FILMS WITH GRADED VERTICAL CONCENTRATION FORMED USING REACTIVE SPUTTERING IN A RADIO FREQUENCY DEPOSITION CHAMBER

(71) Applicant: International Business Machines Corporation, Armonk, NY (US)

(72) Inventors: Ekmini Anuja De Silva, Slingerlands, NY (US); Yongan Xu, Niskayuna, NY (US); Abraham Arceo de la Pena, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/948,007

(22) Filed: Apr. 9, 2018

(65) Prior Publication Data
US 2019/0309410 A1    Oct. 10, 2019

(51) Int. Cl.
*H01L 21/00* (2006.01)
*C23C 14/34* (2006.01)
*H01L 21/285* (2006.01)
*C23C 14/54* (2006.01)
*C23C 14/35* (2006.01)

(52) U.S. Cl.
CPC .......... *C23C 14/345* (2013.01); *C23C 14/351* (2013.01); *C23C 14/54* (2013.01); *H01L 21/2855* (2013.01)

(58) Field of Classification Search
CPC ..... C23C 14/345; C23C 14/351; C23C 14/54; H01L 21/2855
See application file for complete search history.

(56) References Cited

U.S. PATENT DOCUMENTS

| 5,580,823 A | 12/1996 | Hegde et al. |
| 5,593,511 A | 1/1997 | Foster et al. |
| 6,342,133 B2 | 1/2002 | D'Couto et al. |

(Continued)

OTHER PUBLICATIONS

P. Patsalas et al., "The Effect of Substrate Temperature and Biasing on the Mechanical Properties and Structure of Sputtered Titanium Nitride Thin Films," Surface and Coatings Technology, Mar. 2000, pp. 335-340, vol. 125, Nos. 1-3.

(Continued)

*Primary Examiner* — Mounir S Amer
*Assistant Examiner* — Alexander Belousov
(74) *Attorney, Agent, or Firm* — James Nock; Ryan, Mason & Lewis, LLP

(57) ABSTRACT

A method of forming a semiconductor structure includes, in a radio frequency (RF) deposition chamber, depositing a titanium film using physical vapor deposition and forming a graded hard mask film by reactive sputtering the titanium film with nitrogen in the RF deposition chamber. The graded hard mask film is a titanium nitride film with a graded vertical concentration of nitrogen. The method may further include, during deposition of the titanium film and during formation of the graded hard mask film, modulating one or more parameters of the RF deposition chamber, such as modulating an auto capacitance tuner (ACT) current, modulating the RF power, and modulating the pressure of the RF deposition chamber.

13 Claims, 5 Drawing Sheets

(56) References Cited

U.S. PATENT DOCUMENTS

| | | | |
|---|---|---|---|
| 6,429,538 B1 | 8/2002 | Lin | |
| 6,740,585 B2 | 5/2004 | Yoon et al. | |
| 7,727,882 B1 * | 6/2010 | Wu | H01L 21/2855 |
| | | | 257/E21.584 |
| 7,825,510 B2 * | 11/2010 | Forster | H01L 21/2855 |
| | | | 257/734 |
| 9,499,901 B2 | 11/2016 | Cao et al. | |
| 2007/0089984 A1 * | 4/2007 | Gaydos | B22F 3/15 |
| | | | 204/298.12 |
| 2009/0057787 A1 | 3/2009 | Matsuki et al. | |
| 2010/0252417 A1 | 10/2010 | Allen et al. | |
| 2011/0151173 A1 * | 6/2011 | Ramadas | C23C 14/0073 |
| | | | 428/76 |
| 2015/0252467 A1 | 9/2015 | Allen et al. | |
| 2016/0204205 A1 * | 7/2016 | Meldrim | H01L 27/11556 |
| | | | 257/314 |
| 2016/0244874 A1 * | 8/2016 | Ge | C23C 14/345 |
| 2018/0142343 A1 * | 5/2018 | Zeng | C23C 14/0057 |

OTHER PUBLICATIONS

Fabien Piallat, "Plasma Assisted Chemical Deposition (CVD/ALD) and Integration of Ti(Al)N and Ta(Al)N for Sub-20 nm Metal Gate," Doctoral Dissertation, Universite de Grenoble, Jun. 4, 2014, 210 pages.

\* cited by examiner

FIG. 5
500

| | DC-BASED PROCESS | RF-BASED DEPOSITION METHOD |
|---|---|---|
| STRESS (MPa) | -500-900 | -50 – +100 |
| DENSITY (g/cc) | 3.5-4.5 | >5 |
| ROUGHNESS (nm) | 1.5-2.5 | 0.5-1 |
| AVERAGE TiN GRAIN SIZE (Å) | 200-300 | 50-100 |
| SURFACE FILM COMPOSITION THROUGH XPS ATOMIC % | Ti-36%, N-33%, O-29% | Ti-40%, N-41%, O-17% |

FIG. 6
600

| FILM TYPE | VERTICAL FILM THICKNESS (Å) | 1D STRESS (MPa) | 2D STRESS (MPa) | RF POWER (kW) | ACT CURRENT (A) | PRESSURE (mTorr) |
|---|---|---|---|---|---|---|
| DC-BASED PROCESS | 200 | -1041 | -1051 | NO RF CONDITIONS - N/A | | |
| RF-BASED DEPOSITION METHOD (v1) | 200 | 25 | 10 | 3.5 | 3.1 | 130 |
| RF-BASED DEPOSITION METHOD (v2) | 200 | 90 | 75 | 3.2 | 2.25 | 160 |

HARD MASK FILMS WITH GRADED VERTICAL CONCENTRATION FORMED USING REACTIVE SPUTTERING IN A RADIO FREQUENCY DEPOSITION CHAMBER

BACKGROUND

The present application relates to semiconductors, and more specifically, to techniques for forming semiconductor structures. Integrated circuits may include a plurality of semiconductor devices and interconnect wiring. Metal interconnect wiring may connect the semiconductor devices from above a semiconductor portion of a substrate. Multiple levels of metal interconnect wiring about the semiconductor portion of the substrate may be connected together to form back-end-of-line (BEOL) interconnect structures. Within such structures, metal lines may run parallel to the substrate with conductive vias running perpendicular to the substrate. The conductive vias interconnect the different levels of the metal interconnect wiring.

SUMMARY

Illustrative embodiments of the invention provide techniques for forming hard mask films with low stress and high density, thus improving line wiggling and line edge roughness (LER) for self-aligned via processing.

In one embodiment, a method of forming a semiconductor structure comprises, in a radio frequency (RF) deposition chamber, depositing a titanium film using physical vapor deposition and forming a graded hard mask film by reactive sputtering the titanium film with nitrogen in the RF deposition chamber. The graded hard mask film comprises a titanium nitride film with a graded vertical concentration of nitrogen.

In another embodiment, a semiconductor structure comprises a substrate and a hard mask layer patterned over the substrate to define one or more self-aligned vias in the substrate. The hard mask layer comprises a titanium nitride film with a graded vertical concentration of nitrogen.

In another embodiment, an integrated circuit comprises a semiconductor structure comprising a substrate and a hard mask layer patterned over the substrate to define one or more self-aligned vias in the substrate. The hard mask layer comprises a titanium nitride film with a graded vertical concentration of nitrogen.

BRIEF DESCRIPTION OF THE DRAWINGS

FIG. 5 depicts a table illustrating properties of hard mask films formed with and without radio frequency-based deposition, according to an embodiment of the present invention.

FIG. 6 depicts another table illustrating properties of hard mask films formed with and without radio frequency-based deposition using varying current, power and pressure conditions, according to an embodiment of the present invention.

DETAILED DESCRIPTION

Illustrative embodiments of the invention may be described herein in the context of illustrative methods for forming hard mask films with graded vertical concentration having low stress and high density, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Continued innovation in semiconductor fabrication technologies enables higher integration densities and device scaling. Self-aligned via (SAV) formation, such as during back-end-of-line (BEOL) processing, can introduce line wiggling and line edge roughness (LER). Line wiggling and LER improvement during SAV formation is key for sub-36 nanometer (nm) patterning. Current hard mask films, such as titanium nitride (TiN) hard mask films, often have high compressive stress and are thus not sufficient or suitable for scaling to smaller geometries. The grain size of current hard mask films (e.g., current TiN hard mask films) is at or around pitch scale, which is too large to provide the desired scaling. Therefore, a need exists for creating low stress and high-density hard mask films that can improve line wiggling and LER.

Figure 1:
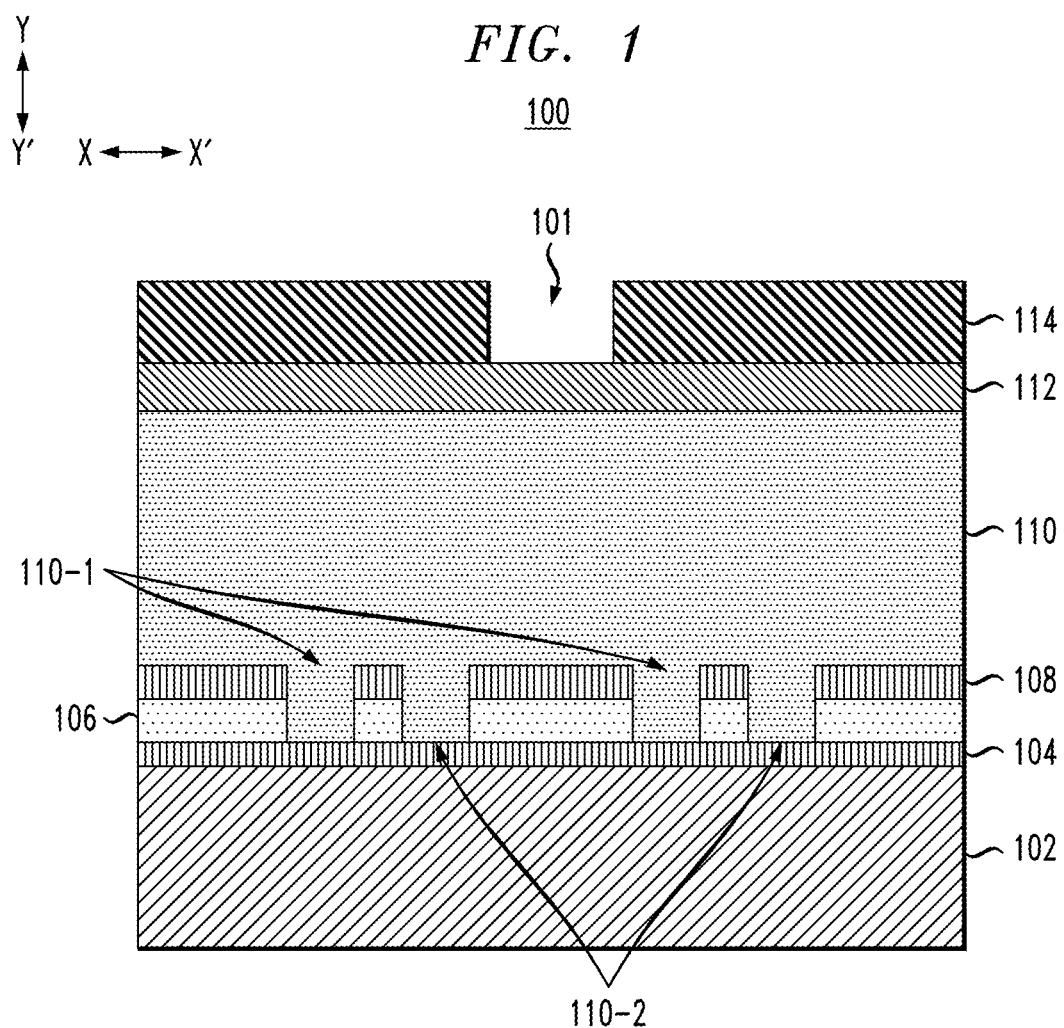
FIG. 1 depicts a side cross-sectional view of a structure for forming a self-aligned via through via single exposure, according to an embodiment of the present invention.

FIG. 1 depicts a side cross-sectional view 100 of a semiconductor structure. The structure includes a dielectric layer 102, which may be formed of an organic silicon material such as octamethylcyclotetrasiloxane (OMCTS) or another suitable material, with a vertical thickness (in direction Y-Y') ranging from 600 to 1000 angstroms (Å).

A tetraethyl orthosilicate (TEOS), low temperature silicon oxide or sacrificial nitride layer 104 is formed over the dielectric layer 102. The TEOS layer 104 may have a vertical thickness (in direction Y-Y') ranging from 100 to 300 Å.

A hard mask layer 106, which may be formed of TiN or another suitable material such as titanium nitride oxide (TiNO), is formed over the TEOS layer 104. The hard mask layer 106 may have various vias formed therein, which are filled with an organic planarization layer (OPL) as will be described in further detail below. The hard mask layer 106 may have a vertical thickness (in direction Y-Y') ranging from 100 to 300 Å.

Another TEOS or low temperature silicon oxide layer 108 is formed over the hard mask layer 106. The TEOS layer may have a vertical thickness (in direction Y-Y') ranging from 100 to 300 Å.

An OPL layer 110 is formed over the TEOS layer 108. The OPL layer 110 may be formed of any suitable spin-on organic planarization layer. The OPL layer 110 may have a vertical thickness (in direction Y-Y') ranging from 100 to 300 Å. As mentioned above, vias or trenches may be formed in the hard mask layer 106, which are filled with the OPL material as shown, including trenches 110-1 each having a horizontal width (in direction X-X') ranging from 200 to 1000 Å, and trenches 110-2 each having a horizontal width (in direction X-X') ranging from 200 to 1000 Å.

The structure of FIG. 1 illustrates a double patterning, such that trenches are patterned at two levels—in a first level the trenches 110-1 are patterned and in a second level the trenches 110-2 are patterned. The trenches 110-1 and 110-2, however, may also be patterned in a single expose step, such that the trenches 110-1 and 110-2 are patterned as one level.

A silicon anti-reflective coating layer (SiARC) layer 112 is formed over the OPL layer 110. The SiARC layer 112 may have a vertical thickness (in direction Y-Y') ranging from 100 to 400 Å.

A resist layer 114, which may be formed of organic chemically amplified resist (CAR) or another suitable material, is formed over the SiARC layer 112. The resist layer 114 may have a vertical thickness (in direction Y-Y') ranging from 200 to 1000 Å. The resist layer 114 is patterned as shown to provide an opening 101, which may have a horizontal width (in direction X-X') ranging from 200 to 1000 Å.

The opening 101 is provided for further trench patterning. Thus, trenches may be formed at multiple levels. Hard mask layers formed using the techniques described herein (e.g., graded TiN hard mask films formed using a radio frequency (RF)-based deposition process) provide advantages for such multiple patterning of different trenches, as well as self-aligned via patterning described in more detail below with respect to FIG. 2.

The structure of FIG. 1 may be formed using metal lithography triple or multiple patterning (e.g., to form the trenches 110-1, 110-2 and opening 101 for an additional trench). In some embodiments, the hard mask layer 106 is formed as a graded TiN film using a RF-based deposition process described herein, such that the hard mask layer 106 has a high density and low stress. This lowers line wiggling and LER during formation of the trenches 110-1 and 110-2, as well as during formation of the opening 101 for an additional trench. Having the hard mask layer 106, also referred to as a memorization layer, that is low stress with low grain boundary helps with scaling and minimizes the risk of line wiggling.

Figure 2:
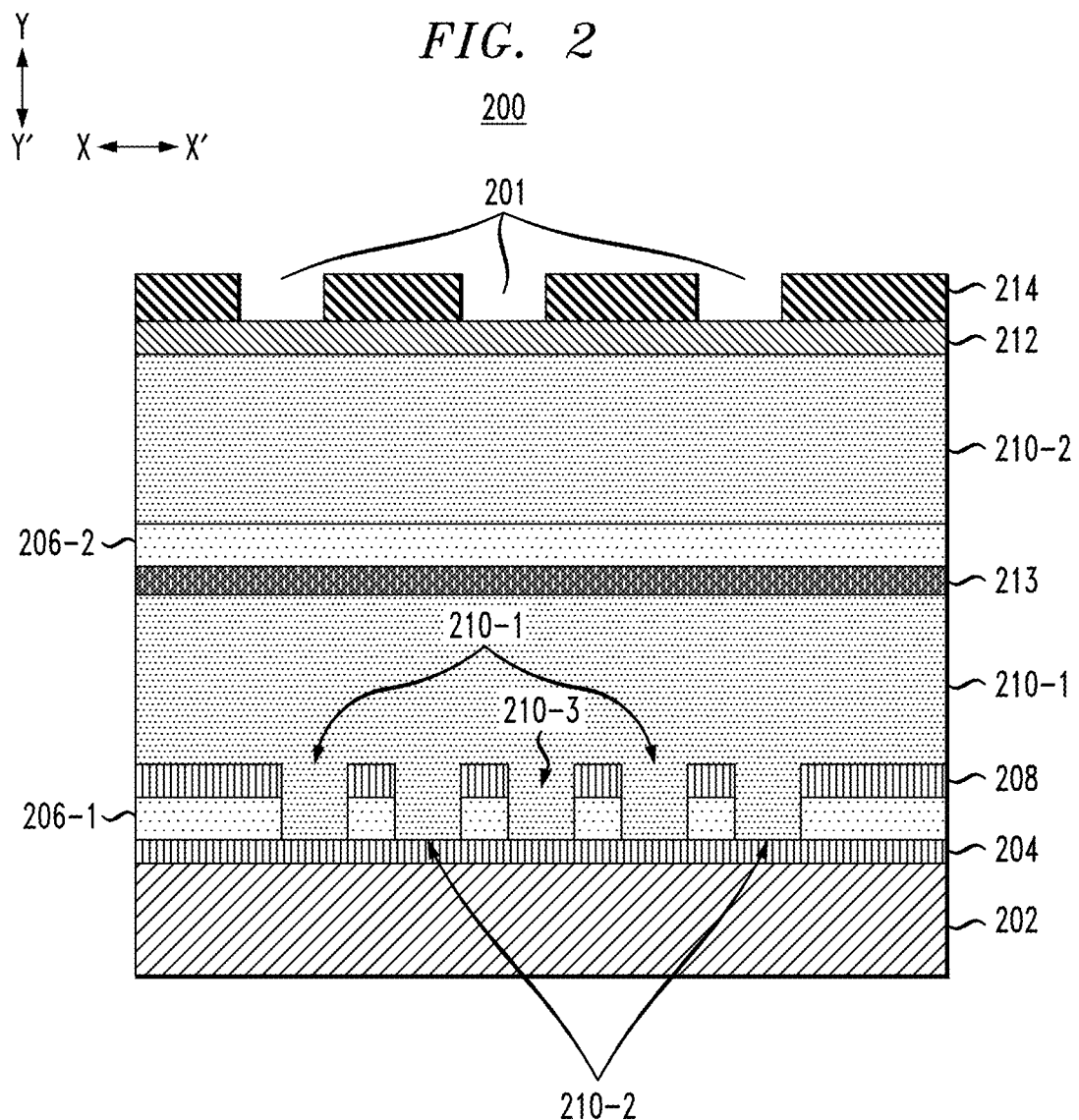
FIG. 2 depicts a side cross-sectional view of a structure for forming a self-aligned via through via double or multiple exposure, according to an embodiment of the present invention.

FIG. 2 shows a side cross-sectional view 200 of a semiconductor structure, which may be formed after additional processing steps are applied to the FIG. 1 structure. The structure of FIG. 1, as described above, illustrates multiple patterning for forming various trenches (e.g., trenches 110-1, 110-2 and trench 110-3 formed using opening 101 as will be described in further detail below). After formation of the various trenches 110-1, 110-2 and 110-3 (collectively, trenches 110), lithography patterning processing is used again to form SAV, such as using openings 201 described in further detail below. The via patterning can be formed through a double or multiple exposure process, such as three-color exposure. In a double exposure case, the via structure from both the first exposure and the second exposure will be memorized in hard mask 206-2, followed by pattern transfer etch into hard mask 213 at the same time.

The structure includes a dielectric layer 202, TEOS or sacrificial nitride layer 204, hard mask layer 206-1, TEOS layer 208, and OPL layer 210-1, which may be formed of similar materials and with similar sizing as that of the dielectric layer 102, TEOS or sacrificial nitride layer 104, hard mask layer 106, TEOS layer 108 and OPL layer 110, respectively.

The FIG. 1 structure, as discussed above, included trenches 110-1 and 110-2 formed in the hard mask layer 106. The FIG. 2 structure similarly includes trenches 210-1 and 210-2, as well as an additional trench 210-3 that is formed from the opening 101. The trench 210-3 is the last trench layer for a lithography-etch-lithography-etch-lithography-etch (LELELE) triple patterning process. The trench 210-3 is "memorized" in the hard mask layer 206. After the trench 210-3 is formed, one or more vias are formed.

A low-temperature oxide (LTO) layer 213 is formed over the OPL layer 210-1. The LTO layer 213 may have a vertical thickness (in direction Y-Y') ranging from 100 to 300 Å.

Another hard mask layer 206-2 is formed over the LTO layer 213. The hard mask layer 206-2, similar to the hard mask layer 206-1, may be formed of similar materials and with similar sizing as that of the hard mask layer 106.

Another OPL layer 210-2 is formed over the hard mask layer 206-2. The OPL layer 210-2, similar to the OPL layer 210-1, may be formed of similar materials and with similar sizing as that of the OPL layer 110.

SiARC layer 212 is formed over the OPL layer 210-2, and a resist layer 214 is formed over the SiARC layer 212. The SiARC layer 212 and resist layer 214 may be formed of similar materials and with similar sizing as that of the SiARC layer 112 and resist layer 114, respectively.

The resist layer 214 of the FIG. 2 structure includes three openings 201 as illustrated for formation of vias. Each of the openings 201 may have a horizontal width (in direction X-X') ranging from 200 to 1000 Å.

The FIG. 2 structure may be formed using via lithography double patterning, where the the hard mask layers 206-1 and 206-2 are formed with high density and low stress (e.g., as graded TiN films formed using a RF-based deposition process described herein) to lower line wiggling and LER during formation of the trenches 210 and the openings 201 for SAVs.

Embodiments provide techniques for forming TiN films with low or zero stress, for use as a patterning hard mask to improve line wiggling in SAV schemes. Using techniques described herein, TiN films may be formed with a lower grain size which also improves LER performance. The lower grain size, in the crystal phase, affects etching. In any one grain, all atoms are arranged with one particular orientation and one particular pattern. The juncture between adjacent grains is referred to as a "grain boundary." The grain boundary is a transition region in which some atoms are not exactly aligned with either grain. If the lithography edge lands on the grain boundary, the LER can be higher. Thus, reducing the grain size provides various advantages for lithography processing. Further, pattern transfer is easier with lower grain size, as the plasma ions do not have to etch through the grain boundary where atoms are misaligned.

In some embodiments, techniques for forming low or zero stress TiN films include modulating auto capacitance tuner (ACT) current, radio frequency (RF) power and pressure in a RF deposition chamber during formation of the TiN film. The ACT current, RF power and pressure of the RF deposition chamber are control parameters which may be modulated or adjusted during formation of a TiN film so as to reduce stress as will be described in further detail below. In addition, some embodiments may form a graded hard mask film, which includes a high density titanium (Ti) film that is nitridized to form a low stress graded TiN film by reactive sputtering. In reactive sputtering, the Ti is sputtered while it is reacted with nitrogen gas slowly to form TiN.

Figure 3:
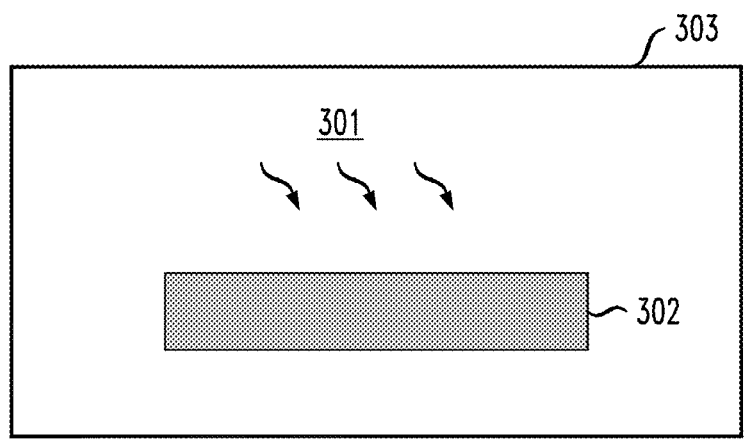
FIG. 3 depicts a side cross-sectional view depicting deposition of titanium, according to an embodiment of the present invention.
Figure 4:
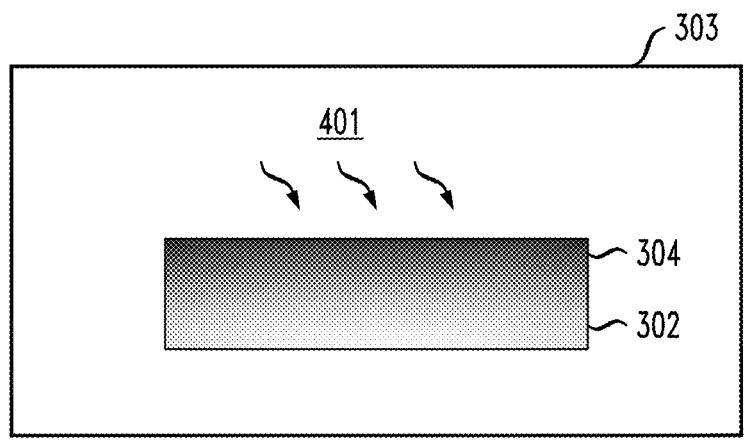
FIG. 4 depicts a side cross-sectional view depicting formation of a titanium nitride film on the FIG. 3 structure through reactive sputtering, according to an embodiment of the present invention.

FIGS. 3 and 4 illustrate a process for forming a low stress and high density TiN film. FIG. 3 shows a side cross-sectional view 300 of deposition of a Ti film 302 through physical vapor deposition (PVD) 301 in a RF deposition chamber 303. The Ti film 302 may have a vertical thickness (in direction Y-Y') ranging from 50 to 100 Å. During deposition of the Ti film 302, the RF-based deposition conditions of the RF deposition chamber 303 may be power of 3.2 kilowatts (kW), pressure of 160 millitorrs (mTorr), argon (Ar) flow of 400 standard cubic centimeters per minute (sccm), and ACT current of 2.5 amperes (A). It is to be appreciated, however, that these parameters may vary in other embodiments, as will be described in further detail below.

FIG. 4 shows a side cross-sectional view 400 of reactive sputtering of the Ti film 302 with nitrogen ($N_2$) resulting in the formation of a $Ti_xN_y$ layer 304 over the Ti film 302. The $Ti_xN_y$ layer 304 may include varying portions or concentrations x and y of Ti and nitrogen (N), resulting in a TiN film with a graded vertical concentration (e.g., $Ti_xN_y$). The graded concentration of the $Ti_xN_y$ layer 304 is graded "vertically" (in direction Y-Y') such that the concentration of N increases towards an upper surface of the $Ti_xN_y$ layer 304 (e.g., the concentration of N is lowest at the top surface of the Ti film 302 and increases towards the upper surface of the $Ti_xN_y$ layer 304). The grading starts with incorporation of nitrogen gas ($N_2$) in the RF deposition chamber 303, so that the gas flow changes (relative to formation of the Ti film 302 as discussed above), from 400 sccm Ar to 200 sccm Ar balanced with $N_2$ flow of 300 sccm. The introduction of nitrogen, however, is done gradually so that the resulting film is continuous. The deposition of Ti does not stop with the TiN film being formed on top as a bilayer. The $N_2$ can be introduced first around 30-50 sccm, where the gas flow will be lower in concentration so that the Ti:N composition is roughly 1:0.25, and then increases to 1:1 in the 75-100% thickness range from the top. Thus, the nitrogen concentration is highest at the top quarter of the film thickness vertically (in direction Y-Y').

FIG. 5 depicts a table 500 which illustrates properties of hard mask films formed with RF-based deposition and without RF-based deposition (e.g., a DC-based process). Such parameters include: stress in megapascals (MPa), where "negative" stress represents compressive stress and "positive" stress represents tensile stress; density in grams per cubic centimeter (g/cc), which may be measured using X-ray reflectance (XRR); roughness (nm), which may be measured using atomic force microscopy (AFM); average TiN grain size (Å); and surface film composition through X-ray photoelectron spectroscopy (XPS), indicating atomic %. Note that the % of oxygen (O) in the TiN film is due to native oxide formation when exposed to air.

The table 500 includes a first column illustrating properties of a TiN hard mask film formed using a DC-based process (e.g., a direct current (DC) magnetron sputtering process) and a second column illustrating properties of a TiN hard mask film formed using the RF-based deposition method described above with respect to FIGS. 3 and 4. As illustrated, the TiN hard mask film formed using the RF-based deposition method exhibits various improved properties relative to the TiN hard mask film formed using the DC-based process. For example, the TiN film formed using the RF-based deposition method advantageously has lower stress than the TiN film formed using the DC-based process (e.g., stress in the range of −50 to 100 MPa versus stress in the range of −500 to −900 MPa).

The TiN film formed using the RF-based deposition method also advantageously has higher density than the TiN film formed using the DC-based process (e.g., density greater than 5 g/cc versus density in the range of 3.5 to 4.5 g/cc). The TiN film formed using the RF-based deposition method further advantageously has a lower grain size than the TiN film formed using the DC-based process (e.g., average grain size in the range of 50 to 100 Å versus average grain size in the range of 200 to 300 Å). The lower grain size allows for more uniformity and better etch characteristics, as described herein.

The RF-based deposition method for forming TiN hard mask films allows for TiN film stress reduction. The RF-based deposition method includes a number of tunable parameters for providing high-pressure deposition to create low stress and high-density films. By adjusting such parameters, the stress of a resulting TiN hard mask film can be modulated. FIG. 6 shows a table 600, illustrating how changes in certain properties results in differing stresses for resulting TiN films. More particularly, the table 600 illustrates properties such as vertical film thickness (Å), 1D stress and 2D stress (e.g., 1D and 2D dimensional stress as measured using an Aleris film stress measurement technique) for three TiN films: (i) a film formed using a DC-based process; (ii) a film formed using a first version ("v1") of the RF-based deposition method; and (iii) a film formed using a second version ("v2") of the RF-based deposition method.

By controlling parameters such as RF power, ACT current and pressure during the RF-based deposition, the resulting v1 and v2 TiN films have different 1D and 2D stresses. The DC-based process, not being formed using a RF-based deposition method, has no parameter values for the RF power, ACT current and pressure. The v1 TiN film is formed using RF power of 3.5 kW, ACT current of 3.5 A and pressure of 140 mTorr, resulting in a film thickness of 233.8 Å, 1D stress of 26 MPa and 2D stress of 5 MPa. The v2 TiN film is formed using RF power of 3.2 kW, ACT current of 2.25 A and pressure of 160 mTorr, resulting in a film thickness of 218.8 Å, 1D stress of 93 MPa and 2D stress of 81 MPa. Both the v1 TiN film and the v2 TiN film exhibit improved characteristics for 1D stress and 2D stress relative to the TiN film formed using the DC-based process.

While table 600 provides specific examples of certain parameters for the RF-based deposition process, it is to be appreciated that embodiments are not limited solely to these specific example parameter sets. Further, it is to be appreciated that the parameters need not be held constant throughout the RF-based deposition process. For example, as discussed above the concentration of Ar and $N_2$ gas may vary over time so as to produce a graded TiN film. Described below are examples of ranges for certain parameters of the RF-based deposition process in some embodiments. Again, however, it is to be appreciated that values outside these ranges may be used in some cases.

In some embodiments, the RF power is in the range of 2-5 kW, or more preferably in the range of 3-4 kW. Generally, RF power in the range of 3-4 kW tends to result in or give neutral stress. The RF power may be made higher or lower to increase stress if desired, and should be balanced with other process parameters such as ACT current and pressure.

In some embodiments, the ACT current is in the range of 1-10 A, or more preferably in the range of 2-4 A. Generally, decreasing the ACT current leads to lower stress in the resulting TiN film, although there is a plateau or diminishing returns and the ACT current should be balanced with other process parameters including the RF power and pressure.

In some embodiments, the pressure is in the range of 100-300 mTorr, or more preferably in the range of 150-200 mTorr. Generally, lower pressure is better for forming a TiN film with neutral stress, though the pressure should be balanced with the RF power and ACT current.

As mentioned above, process parameters such as RF power, ACT current, pressure, flow rates, etc. may be tuned during the RF-based deposition process. The parameters of RF power, ACT current and pressure generally enable the full deposition process to result in a TiN film with low stress, low grain size and high density. The graded nature of the TiN film is a result of the gas flows (e.g., Ar and $N_2$ as discussed above) during the deposition process. The above-noted parameters for RF power, ACT current and pressure may be used to form a non-graded TiN film with low stress and low grain size. In some embodiments, however, the graded TiN film is preferred. The graded nature of the TiN film provides advantages for tuning properties, as a much denser film at the bottom can be formed.

Figure 7:
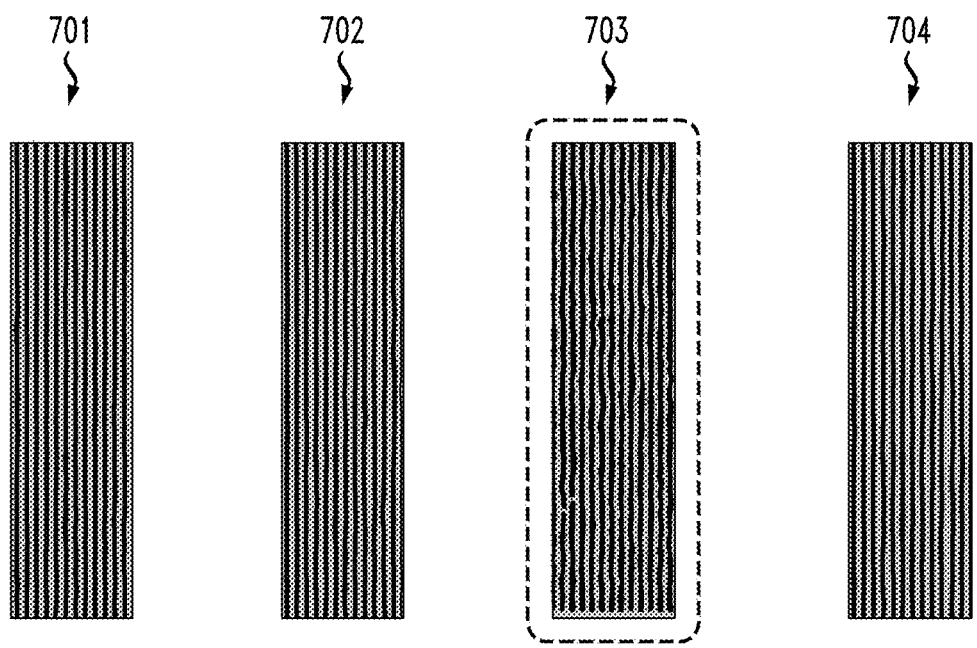
FIG. 7 depicts images illustrating line wiggling and line edge roughness for a hard mask film formed without radio frequency-based deposition, according to an embodiment of the present invention.

FIG. 7 depicts images 701, 702, 703 and 704, showing a structure after various steps in a patterning process, with the structure including a TiN hard mask formed using a conventional process (e.g., a DC-based process). Image 701 shows the structure after lithographic processing, and shows the patterned TiN in light gray and the dielectric substrate underneath in black. Image 702 shows the structure post-trench TiN open. Image 703 shows the structure post-dielectric open (e.g., memorized to the TiN). The image 703, shown in dashed outline, exhibits line wiggling prior to via transfer by RIE and TiN removal by wet chemistry. Image 704 shows the structure post-TiN removal by wet chemistry. The structure in image 704 exhibits LER of 2.6 nm, as a result of the line wiggling prior to the TiN removal by wet chemistry. This line wiggling is a result of lower density and higher stress of the TiN hard mask formed using a conventional process (e.g., using a DC-based process).

Figure 8:
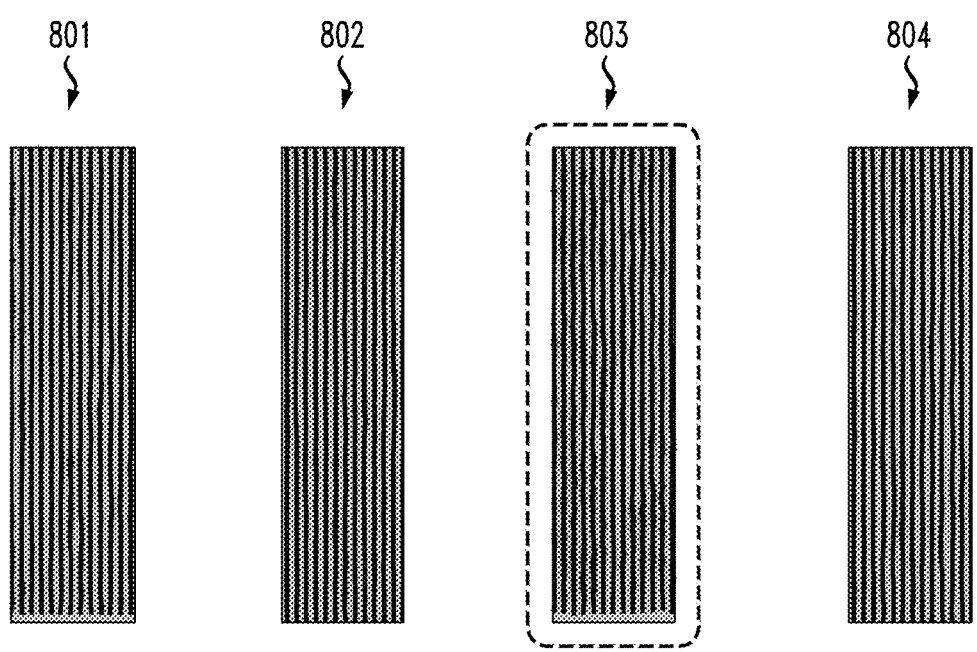
FIG. 8 depicts images illustrating line wiggling and line edge roughness for a hard mask film formed with radio frequency-based deposition, according to an embodiment of the present invention.

FIG. 8 depicts images 801, 802, 803 and 804, showing a structure after various steps in a patterning process, with the structure including a TiN hard mask formed using a RF-based deposition process described herein. Image 801 shows the structure after lithographic process. Image 802 shows the structure post-trench TiN open. Image 803 shows the structure post-dielectric open (e.g., memorized to the TiN). The image 803, shown in dashed outline, exhibits reduced or no line wiggling (relative to the structure in image 703 described above) prior to via transfer through RIE and TiN removal by wet chemistry. Image 804 shows the structure post-TiN removal by wet chemistry. The structure in image 804 exhibits reduced LER of 2.1 nm (relative to the structure shown in image 704 which has LER of 2.6 nm). The reduced line wiggling is a result of higher density and lower stress of the TiN hard mask formed using an RF-based deposition process described herein. The line wiggling and LER can be reduced in some embodiments without sacrificing the hard mask SAV performance.

Embodiments provide techniques for creating hard mask films, such as TiN hard mask films, with zero or low stress and lower grain size using a RF-based deposition. The RF-based deposition enables film stress tuning without compromising film density and dry etch resistance. Using low stress and high-density TiN hard mask films formed using such methods enables better pattern fidelity and low LER for SAV patterning. By modulating ACT current and RF power in a RF deposition chamber, and through a graded hard mask film that comprises a high density Ti film that is nitridized, low stress and high density TiN hard mask films may be formed.

In some embodiments, a method of forming a semiconductor structure comprises, in a RF deposition chamber, depositing a titanium film using physical vapor deposition and forming a graded hard mask film by reactive sputtering the titanium film with nitrogen in the RF deposition chamber. The graded hard mask film comprises a titanium nitride film with a graded concentration of nitrogen.

The method may further include, during deposition of the titanium film and during formation of the graded hard mask film, modulating one or more parameters of the RF deposition chamber, such as modulating an ACT current in the range of 2 to 4 A, modulating the RF power in the range of 3 to 4 kW, and modulating the pressure in the range of 150 to 200 mTorr.

Depositing the titanium film may comprise depositing the titanium film in the RF deposition chamber with a flow of argon gas having a first flow rate and forming the graded hard mask film by depositing titanium while reducing the flow of argon gas from the first flow rate to a second flow rate and introducing a flow of nitrogen gas which increases from a third flow rate to a fourth flow rate. The first flow rate of argon gas may comprise 400 sccm, and the second flow rate of argon gas may comprise 200 sccm. The third flow rate of nitrogen gas may comprise 30-50 sccm, and the fourth flow rate of nitrogen gas may comprise 300 sccm.

The graded hard mask film may comprise a $Ti_xN_y$ film where the concentration of nitrogen varies vertically in a plane perpendicular to a top surface of the titanium film. The value of y may be lowest at the top surface of the titanium film and may increase as distance from the top surface of the titanium film increases.

The graded hard mask film may comprise a TiN film with varying vertical concentrations of both Ti and N, where the vertical concentration of Ti in the TiN film decreases relative to the concentration of N in the TiN film as distance from a top surface of the titanium film increases. The TiN film may comprise a bottom portion disposed adjacent the top surface of the titanium film, and an upper portion disposed over the bottom portion. The bottom portion of the TiN film may comprise a concentration of Ti:N of approximately 1:0.25, and the upper portion of the TiN film may comprise a vertically graded concentration of Ti:N which increase from 1:0.25 to 1:1.

In some embodiments, a semiconductor structure comprises a substrate and a hard mask layer patterned over the substrate to define one or more self-aligned vias in the substrate. The hard mask layer comprises a TiN film with a graded vertical concentration of nitrogen.

The hard mask layer may be formed by reactive sputtering of nitrogen on a titanium film in a RF deposition chamber.

The graded hard mask film may comprise a $Ti_xN_y$ film wherein the concentration of nitrogen varies in a plane perpendicular to a top surface of the titanium film, such that the value of y is lowest at the top surface of the titanium film and increases as distance from the top surface of the titanium film increases.

The graded hard mask film may comprise a TiN film with varying vertical concentrations of Ti and N, with the TiN film comprising a bottom portion disposed adjacent a top surface of the titanium film and an upper portion disposed over the bottom portion, the bottom portion of the TiN film comprising a concentration of Ti:N of approximately 1:0.25 and the upper portion of the TiN film comprising a vertically graded concentration of Ti:N which increases from 1:0.25 to 1:1.

In some embodiments, an integrated circuit comprises a semiconductor structure comprising a substrate and a hard mask layer patterned over the substrate to define one or more self-aligned vias in the substrate, wherein the hard mask layer comprises a titanium nitride film with a graded vertical concentration of nitrogen.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:
   in a radio frequency (RF) deposition chamber, depositing a titanium film using physical vapor deposition;
   forming a graded hard mask film by reactive sputtering the titanium film with nitrogen in the RF deposition chamber; and
   modulating an auto capacitance tuner (ACT) current of the RF deposition chamber in a range of 2 to 4 amperes, an RF power of the RF deposition chamber in a range of 3 to 4 kilowatts, and a pressure of the RF deposition chamber in a range of 150 to 200 millitorrs during formation of the graded hard mask film to reduce resulting stress of the graded hard mask film;
   wherein the graded hard mask film comprises a titanium nitride film with a graded vertical concentration of nitrogen;
   wherein the graded hard mask film comprises:
      a first non-zero concentration of nitrogen proximate a bottom surface of the titanium nitride film; and
      a second non-zero concentration of nitrogen proximate a top surface of the titanium nitride film, the second non-zero concentration of nitrogen being different than the first non-zero concentration of nitrogen.

2. The method of claim 1, wherein:
   depositing the titanium film comprises depositing the titanium film in the RF deposition chamber with a flow of argon gas having a first flow rate; and
   forming the graded hard mask film comprises depositing titanium while reducing the flow of argon gas from the first flow rate to a second flow rate and introducing a flow of nitrogen gas which increases from a third flow rate to a fourth flow rate.

3. The method of claim 2, wherein the first flow rate of argon gas comprises 400 standard cubic centimeters per minute (sccm) and the second flow rate of argon gas comprises 200 sccm.

4. The method of claim 2, wherein the third flow rate of nitrogen gas comprises 30-50 sccm and the fourth flow rate of nitrogen gas comprises 300 sccm.

5. The method of claim 2, wherein the third flow rate comprises a first non-zero flow rate of nitrogen gas and the fourth flow rate comprises a second non-zero flow rate of nitrogen gas.

6. The method of claim 1, wherein the graded hard mask film comprises a titanium nitride ($Ti_xN_y$) film wherein the concentration of nitrogen varies vertically in a plane perpendicular to a top surface of the titanium film.

7. The method of claim 6, wherein the value of y is lowest at the top surface of the titanium film and increases as distance from the top surface of the titanium film increases.

8. The method of claim 1, wherein the graded hard mask film comprises a titanium nitride (TiN) film with varying vertical concentrations of titanium (Ti) and nitrogen (N).

9. The method of claim 8, wherein the vertical concentration of Ti in the TiN film decreases relative to the concentration of N in the TiN film as distance from a top surface of the titanium film increases.

10. The method of claim 8, wherein the TiN film comprises a bottom portion disposed adjacent a top surface of the titanium film and an upper portion disposed over the bottom portion.

11. The method of claim 10, wherein the bottom portion of the TiN film comprises a concentration of Ti:N of approximately 1:0.25 and the upper portion of the TiN film comprises a vertically graded concentration of Ti:N which increases from 1:0.25 to 1:1.

12. The method of claim 1, wherein the graded hard mask film comprises a continuous change from the first non-zero concentration of nitrogen to the second non-zero concentration of nitrogen as distance from the top surface of the titanium nitride film decreases.

13. The method of claim 12, wherein the second non-zero concentration is greater than the first non-zero concentration.

* * * * *